(12) United States Patent
Gil et al.

(10) Patent No.: US 7,548,828 B2
(45) Date of Patent: Jun. 16, 2009

(54) AUTOMATIC TEST EQUIPMENT PLATFORM ARCHITECTURE USING PARALLEL USER COMPUTERS

(75) Inventors: Yun Jae Gil, Brookline, MA (US); Sung Jae Ghil, Kyunggi-Do (KR); Steve Sooyoon Oh, Northridge, CA (US)

(73) Assignee: Testiary, Inc., Kyunggido (KR)

( * ) Notice: Subject to any disclaimer, the term of this patent is extended or adjusted under 35 U.S.C. 154(b) by 0 days.

(21) Appl. No.: 11/847,481

(22) Filed: Aug. 30, 2007

(65) Prior Publication Data

US 2008/0059108 A1 Mar. 6, 2008

Related U.S. Application Data

(60) Provisional application No. 60/841,799, filed on Aug. 31, 2006.

(51) Int. Cl.
*G06F 19/00* (2006.01)
*G06F 11/00* (2006.01)
*G01R 31/00* (2006.01)

(52) U.S. Cl. ............... 702/121; 702/118; 714/733; 714/742; 324/763; 324/765

(58) Field of Classification Search ............... 702/117, 702/118, 119; 324/754, 763, 765; 714/733, 714/735, 742
See application file for complete search history.

(56) References Cited

U.S. PATENT DOCUMENTS

| 4,707,834 A | 11/1987 | Frisch et al. | |
| 6,018,814 A | 1/2000 | Rockoff | |
| 7,385,385 B2 * | 6/2008 | Magliocco et al. | 324/158.1 |
| 2003/0208713 A1 * | 11/2003 | Evans | 714/742 |
| 2005/0261856 A1 * | 11/2005 | Kushnick et al. | 702/117 |
| 2008/0030203 A1 * | 2/2008 | Chung et al. | 324/537 |

* cited by examiner

*Primary Examiner*—Bryan Bui
(74) *Attorney, Agent, or Firm*—Fish & Associates, PC

(57) ABSTRACT

The present invention provides a system of testing semiconductor devices. The system comprises a central host computer, an array of user computers (the array), and a HU (Host-User) network as the mean of communication between them. Two user computers are dedicated to one test instrument via UI connections in the instrument test head, a first user computer can be assigned to perform the tasks of generating and delivering data to the test instrument, while a second user computer can be assigned to perform the tasks of receiving and processing information from the same test instrument.

22 Claims, 4 Drawing Sheets

AUTOMATIC TEST EQUIPMENT PLATFORM ARCHITECTURE USING PARALLEL USER COMPUTERS

This application claims priority to U.S. provisional application Ser. No. 60/841,799 filed Aug. 31, 2006.

FIELD OF THE INVENTION

The field of the invention is semiconductor testing.

BACKGROUND

One of the most important steps in the manufacturing of semiconductor devices is to place the device under test to make sure it is free of manufacturing defects and that it functions correctly. This usually involves hooking up a test instrument to the pins of the device under test (DUT) and stimulating the device with electrical signals (stimulus or test pattern) and capturing the response from the device via the pins. To streamline this process, batches of test patterns are automatically generated and applied while captured responses are automatically analyzed in an Automatic Test Equipment (ATE) platform.

As technology advances and semiconductor devices increase in size, speed and complexity, the demands placed upon ATE have also increased. The amount of data that has to be generated and analyzed during the course of testing has increased exponentially. ATEs have to accommodate ever increasing clock speed, as well as ever increasing number of asynchronous clock domains. Semiconductor devices also incorporate more and more blocks of diverse characteristics. These developments in technology make it impossible to test a semiconductor device in a simple uniform manner.

Few modern semiconductor devices with all of its diverse functionalities can be tested with one single instrument. The sensible approach is therefore to test a DUT with multiple instruments in an ATE. This type of ATE architecture comprises one user computer, a user bus and a plurality of instruments, such as described in Frish (U.S. Pat. No. 4,707,834). The communication between the plurality of instruments and the user computer is done through a communication board or a "master controller" on a test head.

No matter how many instruments or what types of instruments are employed, invariably this type of ATE architecture requires the user computer to (1) generate patterns for each instrument, (2) transfer the generated the pattern to each instrument, (3) poll each instrument for status such as test completion, (4) transfer the captured response from the DUT back to the user computer, then (5) process and analyze the captured response into useful data for test engineers.

The communication efficiency between the user computer and instruments is critical for an optimal total test time because the efficiency directly affects the time spent on transferring pattern data to instrument boards and reading back capture vectors from instruments. Especially when multiple DUTs are to be tested concurrently on a single ATE platform, the 'parallel efficiency of test operation' is decided by the communication efficiency and computing resources. Parallel efficiency is the total test time to test a single DUT divided by the total test time to test concurrently multiple DUTs by a single platform.

In order to support ATE of ever increasingly complex DUTs, instrument manufactures have made instruments with greater computing power and storage capacity. Unfortunately, this has only shifted the performance bottleneck to the user computer and the user bus. Regardless of the user bus structure, the user computer can only read from one instrument at a time; and if the instruments are not identical to each other in function, the user computer cannot broadcast but can only write to one instrument at a time. Furthermore, the user computer cannot multitask, no matter how powerful its CPU is. This is because a DUT is almost always a state of art device capable of crunching through data at speed comparable or even greater than the CPU on the use computer. A user computer therefore must generate pattern, process captured data, poll status and transfer data for each instrument in a sequential manner, even though logically many of these tasks need not wait for each other. This bottleneck results in a logjam at the user computer while many expensive instruments idle and wait. The ATE is thus unable to achieve parallel efficiency despite investment in multiple test instruments. Worse yet, if the ATE application is driven by a test program where the generation of test data to DUT depends on previous captured data from DUT, the compilation and the analysis must both be performed on the user computer, resulting in further degradation of efficiency.

The same bottleneck also limits the architecture's scalability. The communication board which routes all traffic between the instruments and the user computer limits the number of instruments that can be added to the system. This in turn limits the number of DUTs that can be simultaneously tested by the ATE. Even if one were to abandon the communication board and instead use a high throughput local area network (eg. Gigabit Ethernet) to connect the user computer with the instruments, the already mentioned performance limitation of the user computer CPU still limits the number of instruments that can be efficiently added to the system.

One approach to increase the parallel efficiency is to buy instruments with as much capability packed in as possible. The promise of this approach is that the increase computational and storage capacity in the instrument alleviate the performance load on the user computer and the user bus. Unfortunately this is not always feasible. Unlike an off-the-shelf computer, an instrument is an expensive capital investment which few companies can afford to constantly upgrade. And because a DUT is almost always a state of art device while an instrument is almost always a hardware built with yesterday's technology, the instrument can never keep up with the DUT. Relying on the best and newest instrument for parallel efficiency is thus ultimately futile.

Another approach is to use BIST (built in self test) or vector compression to reduce traffic on the host bus during ATE. BIST is suitable for highly structured circuit such as memory, but unsuitable elsewhere. Designing a BIST for a dense logic cloud is simply ineffective and impractical because it requires too much engineering effort. Worse yet BIST is a hardware solution requiring a built-in circuit within the DUT; one can't use BIST to promote parallel efficiency during ATE if no BIST circuit was designed in. BIST is thus not a realistic solution to solve the problem of parallel efficiency generally. Compression is an even less suitable solution, because not much bus traffic can be reduced if the generated data and the captured response traveling on the bus are incompressible highly random data.

Yet another approach is to arrange an array of instrument in SIMD (single instruction multiple device) or MIMD (multiple instruction multiple device) parallel configuration such as disclosed by Rockoff (U.S. Pat. No. 6,018,814). The promise of this approach is that instruments in the SIMD/MIMD array communicate with each other directly thus reduce traffic on the "global instruction network". This is an expensive solution requiring instruments to possess the hardware to support the SIMD/MIMD topology. Each instrument in the SIMD must either be custom designed or custom modified from an existing instrument because the hardware to support SIMD/MIMD are not commercially available. To use or build such system requires much up-front engineering cost on custom hardware and software. As semiconductor technology advances, these customizations are often of questionable reusability as to make the initial investment unjustifiable.

Therefore there is still a need for an ATE platform built upon affordable, interchangeable, and easily reconfigurable machines whereas state of the art performance is readily available commercially, and where the topology of the system eliminates logjam at the user computer to achieve both parallel efficiency and scalability. Unlike instruments, user computers are affordable, interchangeable, and easily reconfigurable machines whereas state of the art performance is readily available commercially. It is thus advantageous to move as many computation tasks from instrument to user computers as possible.

SUMMARY OF THE INVENTION

The present invention provides a system of testing semiconductor devices. The system comprises a central host computer, an array of user computers (the array), and a HU (Host-User) network as the mean of communication between them. In preferred embodiments, the HU network is a computer network. The system further comprises an instrument test head to provide UI (User-Instrument) connections as dedicated means of communication between test instruments and user computers in the array. A single test instrument may have UI connections with one, two or more user computers in the array via the instrument test head.

In preferred embodiments where two user computers are dedicated to one test instrument via UI connections in the instrument test head, a first user computer can be assigned to perform the tasks of generating and delivering data to the test instrument, while a second user computer can be assigned to perform the tasks of receiving and processing information from the same test instrument. A computer in the system can be programmed to assign tasks to user computers.

The system minimizes floor area occupied by stacking the central host computer with the array of user computers in a main frame. And to further facilitate the ease of use, the host computer and the user computers in the array can share the same set of human interface devices such as display, keyboard and mouse so a test engineer can switch from one computer to another without switching input devices or displays.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
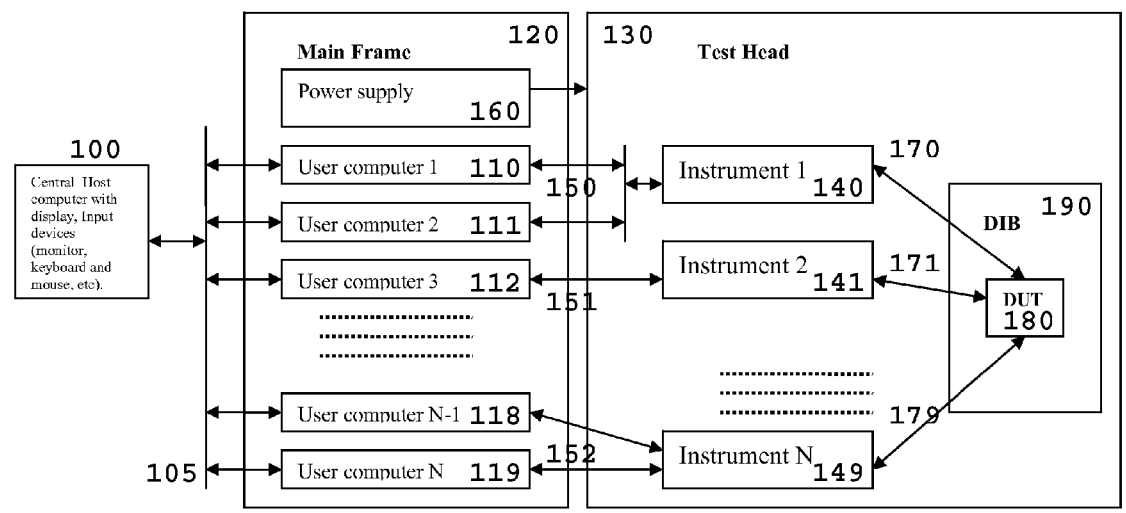
FIG. 1 shows schematic of an ATE platform in accordance with the present invention.

FIG. 1 shows schematic of an ATE platform in accordance with the present invention. A central host computer (100) communicates with an plurality of user computers (110-119) and an optional test vector sequencer (160) via a HU network (115). The array of user computers communicates with a plurality of instruments (140-149) via a plurality of UI connections (150-152) in the test head (130). Instruments generates and/or captures electronic signals via pin connections 170-179 to and from a DUT (device under test) (180) embedded in a DIB (DUT interface board) (190). The power supply (160) to the ATE may be supplied by a main frame (120) or other sources.

Figure 3:
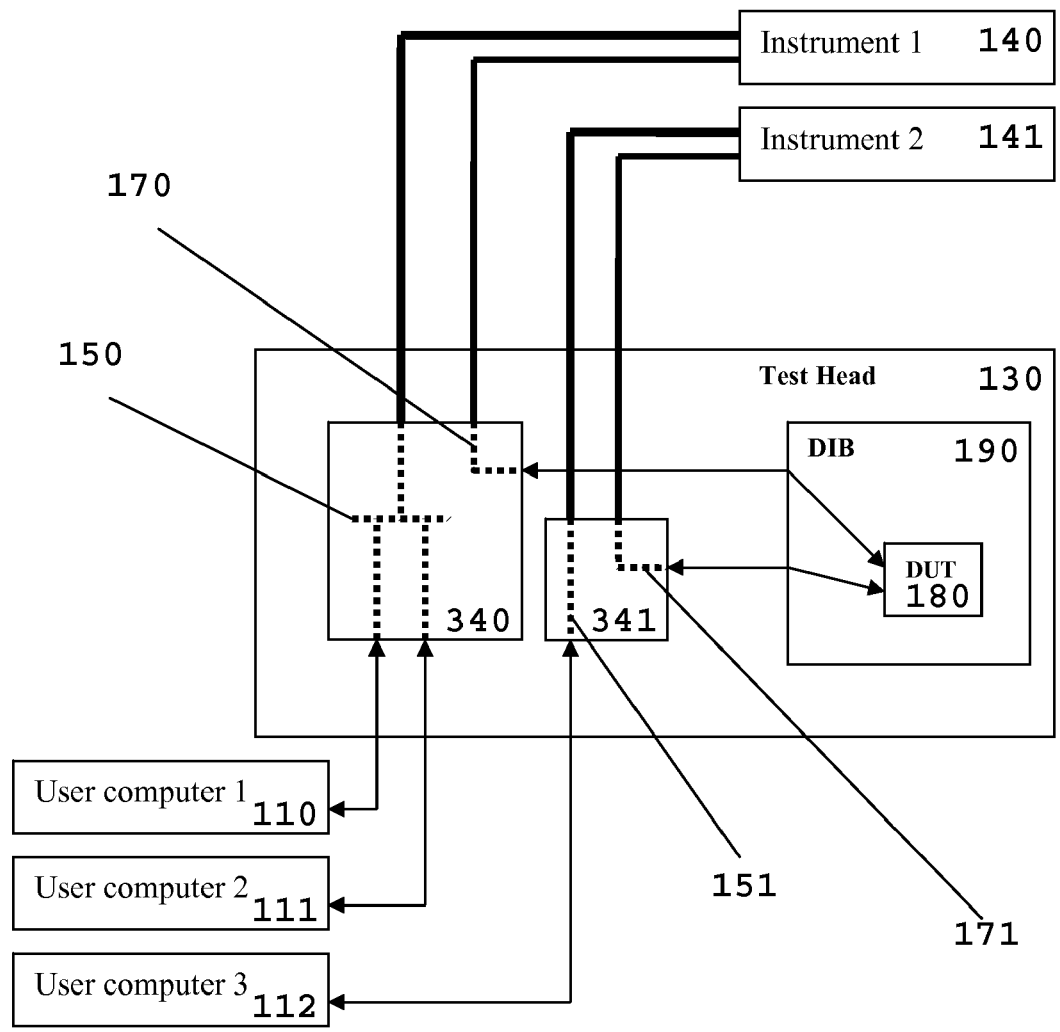
FIG. 3 shows a preferred embodiment of a test head

FIG. 3 shows an exemplary schematic of a test head (130). The test head houses the instrument boards (340,341) together with DIB (190) and DUT (180) and provides the necessary electrical connections in between. Instrument boards 340 are physical and functional extensions of instruments (140,141). Instrument board 340 provides the UI connection 150 between instrument 140, user computer 110 and 111. Instrument board 340 further provides pin connection 170 between instrument 140 and DIB 190. Instrument board 341 provides UI connection 151 between instrument 141 and user computer 112. Instrument board 341 also provides pin connection 171 between instrument 141 and DIB 190.

The DUT (180) may be a digital, analog, mix signal or other semiconductor devices. It can be optionally embedded in a DIB (190) for ease of electrical connections. One or more instruments (140-149) generate electronic signals as stimulus and captures response from the DUT via pin connections 170-179. The stimulus and response signals may be digital or analog, and may comprise signals in multiple asynchronous clock domains. Digital signals and analog signals are often handled by different instruments, as are signals belonging to different clock domains. More than one DUT can be tested simultaneously in this scheme with additional DUTs connected to additional instruments and additional user computers, thus achieving optimal scalability.

Instruments (140) may be logic analyzers, network analyzers, waveform generators, signal generators or other electronic test equipments. Different types of instruments may be incorporated into the system for the testing of digital, analog, RF or other types of circuits in the DUT. These instruments may be custom built or commercially available from manufactures such as Agilent™ and Tektronix™. An instrument in the ATE converts test data from the user computer into a sequence of electrical stimulus for DUT, while the same or a different instrument converts a sequence of captured electrical responses into captured data usable by the user computer. Instruments often possess significant storage capacity so they can store long sequences of stimulus or captured response to support ATE pattern burst.

Test data transferred into instruments from user computer may represent addresses, register contents, logic levels, power settings, frequency settings or any forms of data or command. Captured data retrieved from instrument by user computer may represent digital, analog, RF or other electrical responses. For example, when testing purely digital functionalities, both test data and captured data may be in forms of a digital test vector of symbolic representations. Below is an exemplary table of the symbols in digital test vectors and their meanings.

| Symbol | Meaning |
| --- | --- |
| 1 | Drive '1' to DUT |
| 0 | Drive '0' to DUT |
| X | Don't care |

-continued

| Symbol | Meaning |
| --- | --- |
| V | Capture and expect a valid output from DUT |
| H | Capture and expect '1' from DUT |
| L | Capture and expect '0' from DUT |

An instrument (140,141) may further comprise an instrument board (340,341) as its physical and functional extension. An instrument board provides the necessary hardware for an instrument to interface with other devices in the system such as a DUT and a user computer. Different makes of instrument may have different communication protocols for command and data transfer, or it may have physical connectors incompatible with other devices in the system. Thus an interface device may be necessary to provide the intermediate physical connection, support electronics and glue logics. Still further, the instrument board may further provide functionalities such as test vector sequencer, control and status registers or other support functionalities to facilitate ATE. In preferred embodiments, the instrument board 340 is a printed circuit board electrically connected to the instrument 140 via a cable and housed in a chassis within the test head (130).

Though instruments are often equipped with its own physical knobs and displays, they also respond to commands and status polling from the user computer. For example, the user computer can poll status such "pattern busy" to learn whether the instrument is in the middle of a pattern burst. In another example, the user computer can write to control registers such as such as "loop vector" to command the instrument to repeat the pattern of stimulus. These commands and status can be implemented as part of the instrument board, or part of the built-in functionality of the instrument.

A test head (130) comprises the necessary hardware to connect the instruments (140) to other devices in the ATE such as computers (110) and DUTs (180). In preferred embodiments, the test head is a chassis that physically holds and electrically connect instrument boards (340,341) and along with DUT interface board (DIB) (190). It is contemplated that the test head may facilitate the testing of additional DUTs by providing the necessary electrical connections to additional instruments and user computers. Still further, additional test heads may be incorporated into the system to provide the additional electrical connections.

A plurality of UI connections (150, 151 and 152) are provided by the test head (130) or instrument boards (340,341) as dedicated means of communication between user computers and instruments. As used herein, "dedicated" means a communication channel or medium gives a group of devices priority to communicate with each other over all other devices. In preferred embodiments, a UI connection is a high speed communication network such as Gigabit that connects only devices in the group, and specifically, between one test instrument and one or more user computers. For example, UI connection 150 connects only user computer 1 and 2 (110 and 111) with instrument 1 (140) and no other devices, while UI connection 151 connects only user computer 3 (112) with instrument 2 (141). A UI connection can have an Ethernet-like topology (150) such that every device can communicate with every other device sharing the UI connection. Instrument-centered topologies are also contemplated, such as 152, where user computers 118 and 119 only communicate with instrument 149 but not each other so they need not wait for each other to communicate with the instrument.

In preferred embodiments, an instrument can connect to one or more user computers via a UI connection, while each user computer connects only one instrument via its only UI connection. Thus an instrument can have one or more user computers dedicated to itself. A user computer dedicated to an instrument does not usually interact with or process data for other instruments since they do not have any other UI connections.

UI connections 150, 151 and 152 as dedicated means of communication between user computers and instruments are critical to parallel efficiency of the system because they allow instruments and user computers to immediately commence communication without having to wait for other instruments to finish data transfer or retrieval. UI connection may further facilitate timing critical communication between user computers by providing a shortcut across their mutual UI connection.

A user computer (110-119) is a desktop, laptop, workstation, or a computer of another type. As all computers, it comprises a microprocessor, a memory, a storage device, a human interface and a network apparatus. A user computers compiles test pattern files into instrument specific test data, transfers the compiled instrument specific test data into instrument, programs instrument registers, polls pattern burst busy status, retrieves captured data from instrument, analyzes the captured data, and performs other computation tasks. In preferred embodiments, a user computer dedicates its computation power to only one instrument via its only UI connection, thus it usually only compile pattern for one instrument, transfer data to and retrieve data from one instrument, program and poll registers of one instrument, and analyze captured data of one instrument. Having dedicated user computers further enhances the parallel efficiency because instruments do not have to wait for user computers to finish tasks for other instruments.

The user computer may be programmed to generate test data by compiling a test pattern. The test pattern may be written by a human user or automatically generated by a test program. It may be in any format of a human user's choice, and may or may not be machine readable. The generated test data are usually in machine readable form. In preferred embodiment where instruments in the system may or may not be identical to each other and thus may have different format requirements, each user computer compiles test patterns into test data in formats most readily usable by the target instrument. Test data thus may be in machine specific binary codes comprehensible only to the target instrument. The generated test data is then transferred to the instrument via a UI connection.

In addition to generating test data and transferring the data to the instrument, the user computer may also use its UI connection to program control registers in the instrument or instrument board to control settings or to commence actions such as pattern burst.

Once the pattern burst is complete or when captured data becomes available in the instrument, the user computer may retrieve the captured data via its UI connection and perform analysis on the captured data. The result may comprise an ASCII version of the captured data, a succinct status report, a compressed signature, a pass/fail status or other types of report. A user computer may send the result of the analysis to another user computer via a shared UI connection, or it may send the result of the analysis via the HU network to the central host computer or any computer in the user computer array. The result may be used to generate the next set of test patterns, to halt test or to commence other actions.

The user computer may further be programmed to fetch register contents in the instruments (polling) via its UI connection. These registers may report error condition flags, task completion flags and other status of the instrument. In preferred embodiments, a user computer poll an instrument for its pattern burst busy status in order to know when to commence transferring test data or retrieving captured data. The user computer may also use the polling result as input to the test pattern generation process. Other computers in the system may also receive and use the polling result via a shared UI connection or the HU network.

HU (host-user) network 105 provides the mean of communication between the central host computer (100) and the array of user computers (110-119). The HU network can be any form of electronic communication, including wired or wireless local area network such as 802.3 (Ethernet) or 802.11 (WiFi). HU bus may be a dedicated mean of electronic communication reserved for the ATE, but it may also be part of a larger local area network. For example, an ATE's user computers sitting in the lab may communicate via the building's local area network with the ATE's host computer, whereas that host computer is remotely located in the test engineer's office.

Test data and captured data may also be transferred to or retrieved from another computer in the system via one of the UI connection (150-152) or HU network (105).

A central host computer (100) serves as the ATE's primary interface with human users; it also serves as the supervisory computer of the ATE system. Similar to a user computer, the host computer can be a commercially available computer of any type. In preferred embodiments, the host computer is equipped with display and input devices through which the human user can interact with all devices in the ATE system, including DUT, instruments and user computers. From its supervising position in the ATE hierarchy, the host computer may be programmed to relay information between user computers, to poll status, to issue commands, or to otherwise dynamically control ATE. For example, after receiving a report from one user computer that a particular logic block has failed, the host computer may issue a command to other user computers to initiate diagnostic sequence on the DUT.

To minimize the increase of the floor area due to the multiple user computers, the user computers are preferably stacked in a main frame (120) and share a single set of display and input devices such as keyboard and mouse. The operating system of the user computers provide the capability of sharing a single set of display and input devices so that the test engineer can switch from one user computer to another. In preferred embodiments, none of the user computers directly attach input or display devices; the user of the ATE system uses the keyboard, mouse and monitor etc at the central host computer (100) to interface with each user computers via the HU network (105). This can be done by software such as Remote Desktop Web Connection™, which is part of Microsoft Windows XP™.

Figure 2:
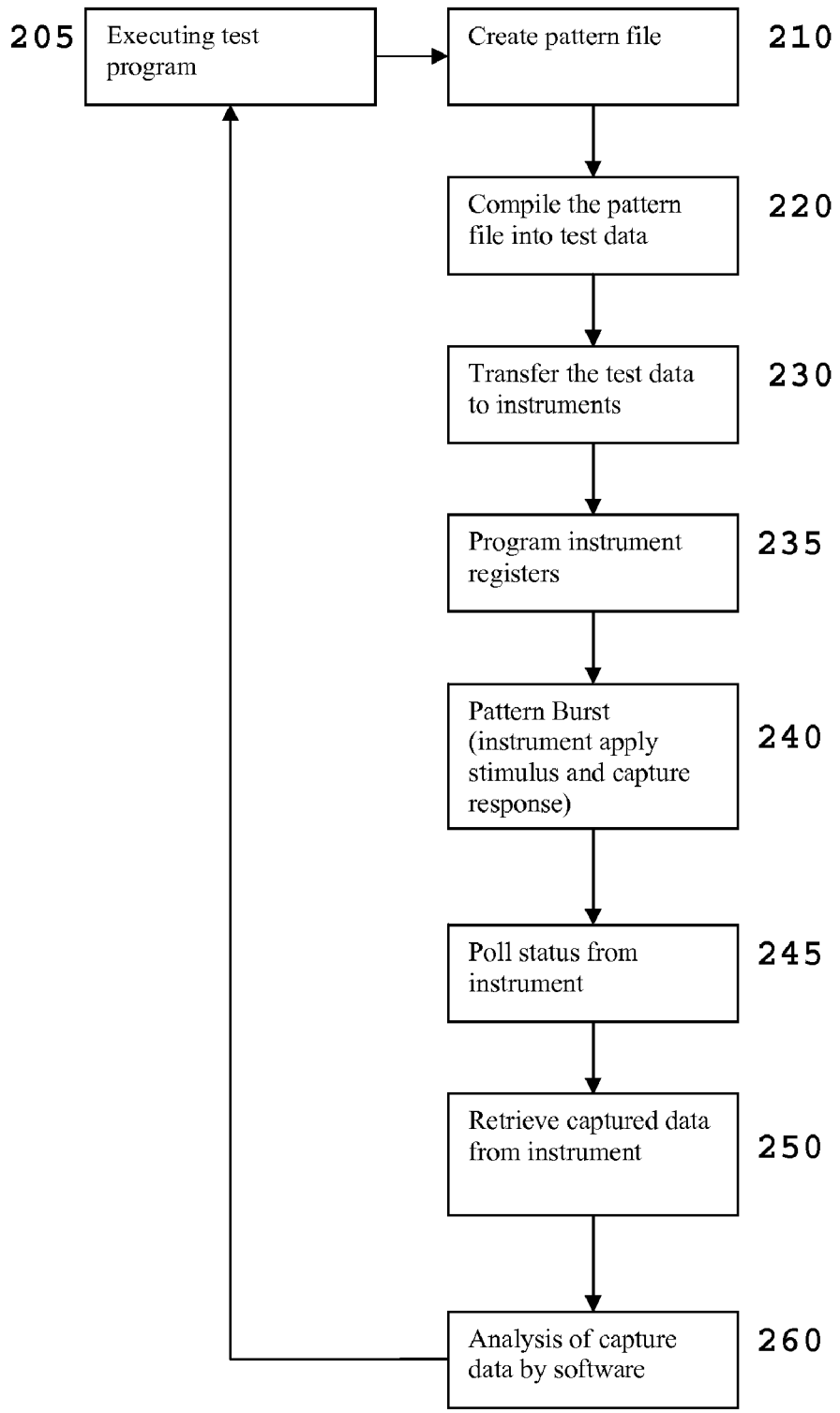
FIG. 2 shows a flowchart of a semiconductor testing process using the ATE platform.

FIG. 2 shows a flowchart of a semiconductor testing process using the ATE platform. A test engineer or a test program (205) write or generate a test pattern file (210). A user computer then compiles the pattern file into instrument-specific test data (220) and then transfers the test data to an instrument (230). The user computer may further program command or settings registers (235) in the instrument before the ATE platform commences testing of the DUT by pattern burst. While instruments are executing the pattern burst (240), the user computer periodically polls each instrument for status (245), for example, to determine whether the instrument has successfully captured response from DUT. After receiving status that the response has been captured and stored, the user computer then retrieve the captured data (250) and begin analysis by software (260). The result of the analysis is optionally fed back to the test program (205) to generate the next set of test pattern.

When an ATE only has one user computer, computing tasks in an ATE process must be executed in such a sequence. But an ATE system with multiple user computers can assign parallel tasks to parallel user computers. For example, when two user computers are dedicated to the same instrument via the same UI connection, one computer can be programmed to perform pattern burst pre-processing tasks, while the other is programmed to perform pattern burst post-processing tasks. Post processing tasks of the previous pattern burst can take place simultaneously with pre-processing tasks of the next pattern burst.

Figure 4:
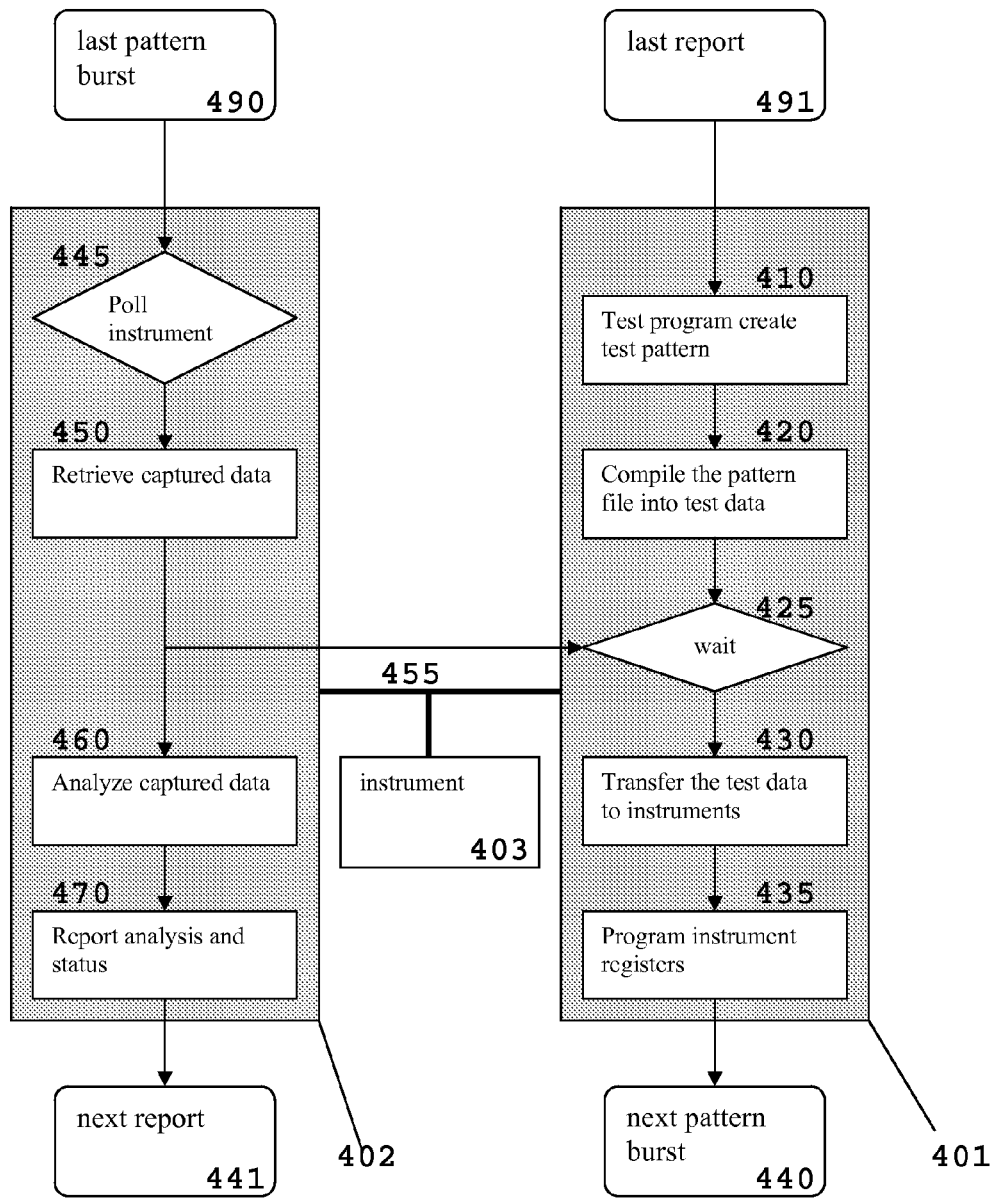
FIG. 4 shows an exemplary accelerated semiconductor testing process using the ATE platform's parallel computing resources.

FIG. 4 shows an exemplary accelerated semiconductor testing process using the ATE platform's parallel computing resources. User computer 1 (401) and user computer 2 (402) are dedicated to an instrument (403) via a shared UI connection (455). User computer 1 generates test pattern (410), compiles test pattern into test data (420), transfers test data into instrument (430), programs instrument registers (435) and launches next pattern burst (440). Simultaneously, user computer 2 polls the instrument for status of the last pattern burst (490), retrieves captured data from instrument (450), analyzes captured data (460) and generate report (470). The report (441) is optionally fed back to user computer 1 as input (491) to the test program (410) for the generation of the next test pattern.

User computer 1 has an optional wait state (425) to ensure transfer of test data (430) occur after retrieval of captured data (450) by user computer 2. This is done to avoid having both user computers vying for access to the instrument. User computer 2 can use its mutual UI connection with user computer 1 to quickly communicate the completion of captured data retrieval.

The instrument (403) is thus able to minimize its idle time and raise the system's parallel efficiency. While one user computer is busy compiling test pattern, the other is retrieving capture data from the instrument; and while one user computer is busy analyzing capture data, the other is transfer test data to the instrument. And when the instrument is not receiving or transmitting data to user computers, it is busy executing pattern burst.

Thus, specific embodiments and applications of systems and methods of facilitating advertising to multiple different electronic business indices have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced. Where the specification claims refers to at least one of something selected from the group consisting of A, B, C . . . and N, the text should be interpreted as requiring only one element from the group, not A plus N, or B plus N, etc.

The invention claimed is:

1. A system for testing a semiconductor device (DUT), comprising:
    first and second semiconductor test instruments that exercise the DUT;
    first and second user computers that monitor output of the test instruments; and
    a test head communicatively coupled to each of the user computers and to each of the test instruments, wherein the test head communicatively couples both the first and second user computers with the first test instrument.

2. The system of claim 1, further comprising a supervisory computer that communicates with each of the first and second user computers.

3. The system of claim 2, wherein the supervisory computer communicates with each of first and second user computers via a local area network.

4. The system of claim 2, wherein the first user computer is programmed to:
    receive communication from the supervisory computer;
    generate test data for the first test instrument using the communication from the supervisory computer; and
    transfer the test data to the first test instrument.

5. The system of claim 1, wherein the test head communicatively couples the first user computer with the first test instrument, and the second user computer with the second test instrument.

6. The system of claim 1, wherein the test head communicatively couples the first user computer with both first and second test instruments.

7. The system of claim 1, wherein the supervisory computer and the first and second user computers all share a keyboard and a display.

8. The system of claim 1, wherein the first and second user computers are physically disposed within a single housing.

9. The first test instrument of claim 1, further comprises a instrument board.

10. The system of claim 1, wherein the first user computer is programmed to:
    generate test data for the first test instrument; and
    transfer the test data to the first test instrument.

11. The system of claim 10, wherein the first test instrument uses the generated data to change the first instrument's settings.

12. The system of claim 10, wherein the first test instrument exercises the DUT according to the generated data.

13. The system of claim 1, wherein the second user computer is programmed to:
    retrieve information from the first test instrument; and
    analyze the information.

14. The system of claim 13, wherein the information retrieved by the second user computer is captured data derived from the DUT's response to the first and second test instrument's exercise of the DUT.

15. The system of claim 13, wherein the information retrieved by the second user computer is a status of the first instrument.

16. The system of claim 13, wherein the information retrieved by the second user computer is a setting of the first instrument.

17. The system of claim 1, wherein the first test instrument tests digital circuits.

18. The system of claim 1, wherein the first test instrument tests analog circuits.

19. The system of claim 1, wherein the first test instrument tests RF circuits.

20. The system of claim 1, wherein the DUT is supported by the test head with a plurality of connections.

21. A system for testing a semiconductor device (DUT), comprising:
    first and second semiconductor test instruments that exercise the DUT;
    first and second user computers that monitor output of the test instruments; and
    a test head communicatively coupled to each of the user computers and to each of the test instruments, wherein the test head communicatively couples both the first and second user computers with the first test instrument and wherein the first user computer communicates with second user computer via the test head.

22. A system for testing a semiconductor device (DUT), comprising:
    first and second semiconductor test instruments that exercise the DUT;
    first and second user computers that monitor output of the test instruments;
    a test head communicatively coupled to each of the user computers and to each of the test instruments, wherein the test head communicatively couples both the first and second user computers with the first test instrument and wherein the first user computer communicates with second user computer via the test head and the first user computer is programmed to:
    receive communication from the second user computer;
    generate test data for the first test instrument using the communication from the second user computer; and
    transfer the test data to the first test instrument.

* * * * *

UNITED STATES PATENT AND TRADEMARK OFFICE
CERTIFICATE OF CORRECTION

PATENT NO. : 7,548,828 B2
APPLICATION NO. : 11/847481
DATED : June 16, 2009
INVENTOR(S) : Yun Jae Gil et al.

It is certified that error appears in the above-identified patent and that said Letters Patent is hereby corrected as shown below:

On title page, item 73 Assignee,
replace "Testiary, Inc"
with "Testian, Inc.."

Signed and Sealed this

Eighteenth Day of August, 2009

David J. Kappos
*Director of the United States Patent and Trademark Office*